United States Patent [19]

Botti

[11] Patent Number: 4,786,878

[45] Date of Patent: Nov. 22, 1988

[54] LOW-FREQUENCY POWER AMPLIFIER, IN PARTICULAR OF THE INTEGRATED TYPE

[75] Inventor: Edoardo Botti, Mortara, Italy

[73] Assignee: SGS Microelettronica S.p.A., Catania, Italy

[21] Appl. No.: 15,655

[22] Filed: Feb. 17, 1987

[30] Foreign Application Priority Data

Feb. 19, 1986 [IT] Italy ............................ 19453 A/86

[51] Int. Cl.[4] ............................................. H03F 1/34
[52] U.S. Cl. ............................... 330/84; 330/124 R; 330/295
[58] Field of Search ............... 330/84, 255, 260, 295, 330/108, 124 R

[56] References Cited

U.S. PATENT DOCUMENTS 4,068,187  1/1978  Amada et al. .................. 330/255 X
4,146,845  3/1979  Lunquist ........................ 330/260 X

OTHER PUBLICATIONS

Cherry, "A High Quality Audio Power Amplifier", Monitor-Proceedings of the IREE Aust., vol. 39, No. 1, Jan/Feb. 1978, pp. 1-8.

Primary Examiner—James B. Mullins
Attorney, Agent, or Firm—Guido Modiano; Albert Josif

[57] ABSTRACT

The low-frequency integrated amplifier comprises a voltage amplifier stage and two power amplifier stages including power amplifier means driven by the voltage amplifier stage and fedback by means of a respective feedback network dimensioned so that, at the frequency at which the phase shift of the power stages exceeds 180°, the open loop gain thereof is less than 0 dB, so as to prevent, for any kind of load and for every output voltage, any oscillation of said stages, and ensure the absolute stability of the system.

4 Claims, 2 Drawing Sheets

LOW-FREQUENCY POWER AMPLIFIER, IN PARTICULAR OF THE INTEGRATED TYPE

BACKGROUND OF THE INVENTION

The present invention relates to a low-frequency power amplifier, in particular of the integrated type, with high stability.

In power amplifiers, most often having as a load a loudspeaker (e.g. being part of an acoustic box) or a servomotor for control systems, or an electromechanical transducer, the power to be supplied by the amplifier can be considerable. The amount of this power does not depend only on the limits of current, of voltage and of the power of the active device, but also on the need to limit the distortion introduced by the load which generally is not a linear element. The practical problem is thus to obtain the maximum useful power with the smallest distortion and with the smallest dissipated power in the active device, so as to minimize, on one hand, the cost, and on the other the dimensions and the weight, as well as the power supplied by the battery.

The problem of the stability of low-frequency power amplifiers is commonly solved, in the prior art, by acting on the voltage amplifier which drives the actual power stage, controlling its frequency response so that the latter can have a pattern which will ensure an adequate phase margin, which is normally greater than 60°, to the complete feedback system. For this purpose, a compensating capacitor is used. With suitable circuitry, it is possible to use a low-value capacity, e.g. between 5 and 30 pF, which can, possibly, be integrated.

On the other hand, the presence of the final power sections requires another compensation, made necessary by the fact that these sections have a relatively high loop gain and are feedback with a unit gain.

Their frequency response, with open loop, as is known, significantly depends both on the characteristics of the load and the output voltage.

These elements, besides the characteristics of the transistors used, may take the poles of the transfer function of the power sections into regions where instabilities can occur.

In order to eliminate these oscillations, the prior art generally makes use of a series R-C network, connected in parallel to the load.

In such a solution, R normally has a value ranging between 1 and 8 ohm, and C ranges between 0.047 and 0.22 uF.

This external network acts so as to reduce the open-loop gain of the entire power amplifier at high frequencies, damping the high-frequency oscillations.

It is easily understood that the high value of the compensating capacity C prevents the integration of the component in an integrated circuit.

SUMMARY OF THE INVENTION

Therefore, in view of the above described disadvantages of known systems for stabilizing the operation of low-frequency power amplifiers, in particular of the integrated type, the aim proposed by the invention is indeed to eliminate the above described disadvantages in a very simple and functional manner by providing a low-frequency power amplifier, in particular of the integrated type, which can operate with high stability in all its intended range of frequencies, and this without the need to add, on the output of the power amplifier, stabilizing networks of the R-C type.

Within this aim, a main object of the invention is to provide an integrated power amplifier with high stability which does not require the integration of additional active stabilizing components in the usual circuitry of the power amplifier itself.

The abovementioned aim and object, and others which will become apparent hereinafter, are achieved by a low-frequency power amplifier, in particular of the integrated type, comprising a voltage amplifier having an inverting input and a non-inverting input, and an output, said output being circuitally connected, to drive them, to a first and a second power amplifier, each having a respective inverting input and a respective non-inverting input, and a respective output, the outputs of said power amplifiers being connected in common and, via a first feedback block, to the inverting input of said power amplifier, a compensating capacitor being inserted between preset contacts of said voltage amplifier, a respective contact of said first power amplifier being connected to the + pole of the power supply and a respective contact of the second power amplifier being connected to the pole of the power supply, the non-inverting input of said first power amplifier being connected to the non-inverting input of said second power amplifier and to the output of said voltage amplifier, characterized in that the inverting input of said first power amplifier is connected to the mutually connected outputs of said first and second power amplifiers via a second feedback block and the inverting input of said second power amplifier is connected to the outputs of said first and second power amplifiers through a third feedback block, said first, said second and said third feedback blocks being selected and dimensioned so that, at the frequency for which the phase differential of said first and second power amplifier exceeds 180°, the gain of said first power amplifier or of said second power amplifier takes on values lower than 0 dB.

BRIEF DESCRIPTION OF THE DRAWINGS

Further characteristic and advantages of the low-frequency power amplifier, in particular of the integrated type, which high stability, according to the present invention, will become apparent from the following detailed description of a preferred embodiment thereof, illustrated only by way of non-limitative example in the accompanying drawings, where.

DESCRIPTION OF THE PREFERRED EMBODIMENTS

Figure 1:
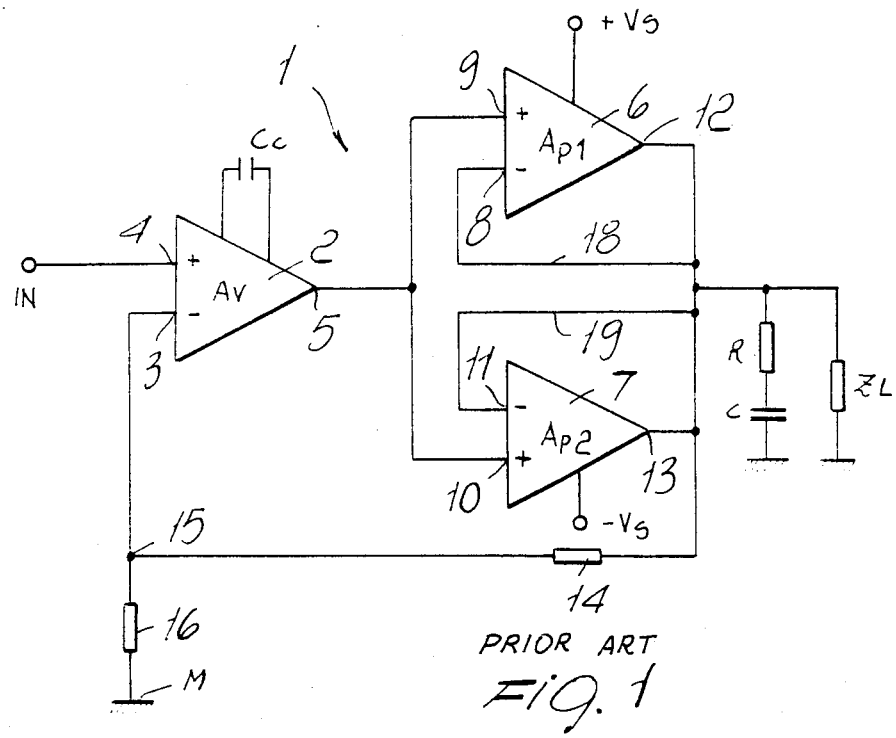
FIG. 1 is a schematic circuit diagram of the low-frequency power amplifier according to the prior art.

With more specific reference to FIG. 1, the same illustrates a block circuit diagram of the structure of a low-frequency power amplifier according to the prior art.

More specifically, this known power amplifier, generally indicated with the reference numeral 1, comprises a voltage amplifier 2, having an inverting input 3, a non-inverting input 4 and an output 5, which output is connected, to drive them, to a first power amplifier means 6 and to a second power amplifier means 7, the power amplifier means 6 having a respective inverting input 8 and a respective non-inverting input 9, and the power amplifier means 7 having a respective non-inverting input 10 and a respective inverting input 11, the outputs 12 and 13 respectively of the amplifier means 6 and of the amplifier means 7 being connected in common and, via a first resistor 14, to the inverting input 3 of the voltage amplifier 2, the connecting point 15 of the first resistor 14 and of the inverting input 3 of the amplifier 2 being connected to ground M via a second resistor 16. A first conductive path 18 connects the inverting input of the first power amplifier means 6 to the output, while a second conductive path 19 connects the inverting input of the second power amplifier means 7 to the output thereof, said outputs of the two amplifier means 6 and 7 being, as has been described, connected in common. A compensating capacitor $C_c$ is inserted, as is conventional, between preset contacts of the voltage amplifier 2.

In order to achieve stabilization, the prior art, as has been described, provides, connected to the output of the two power amplifier means 6 and 7, an R-C network arranged in parallel to the load $Z_L$. It is indeed this network that the invention proposes to eliminate.

Figure 2:
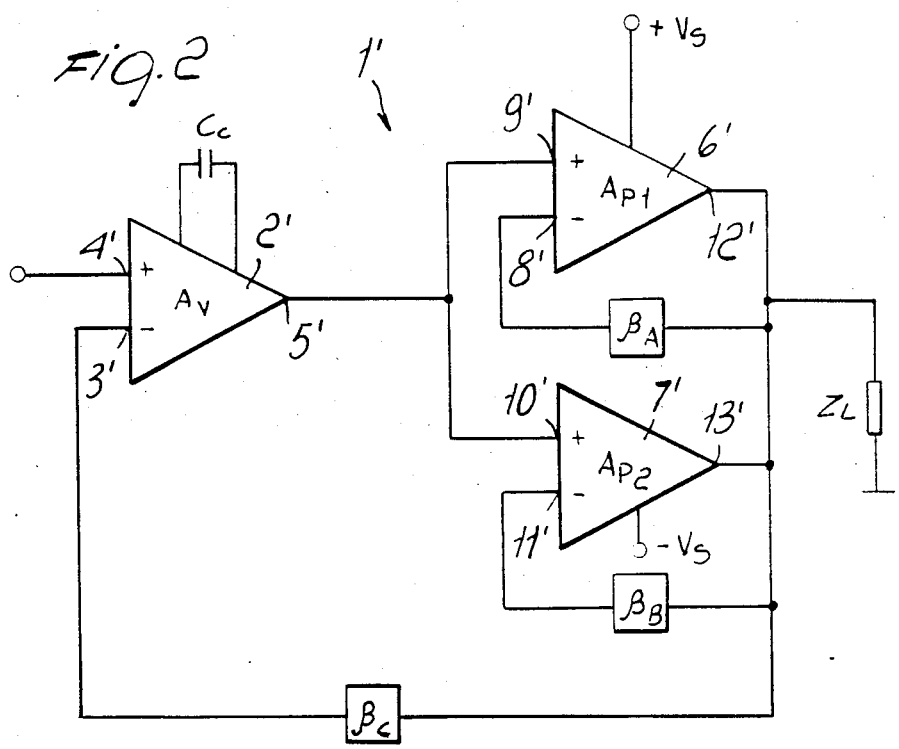
FIG. 2 is a general circuit diagram of the low-frequency power amplifier according to the teachings of the present invention.
Figure 3:
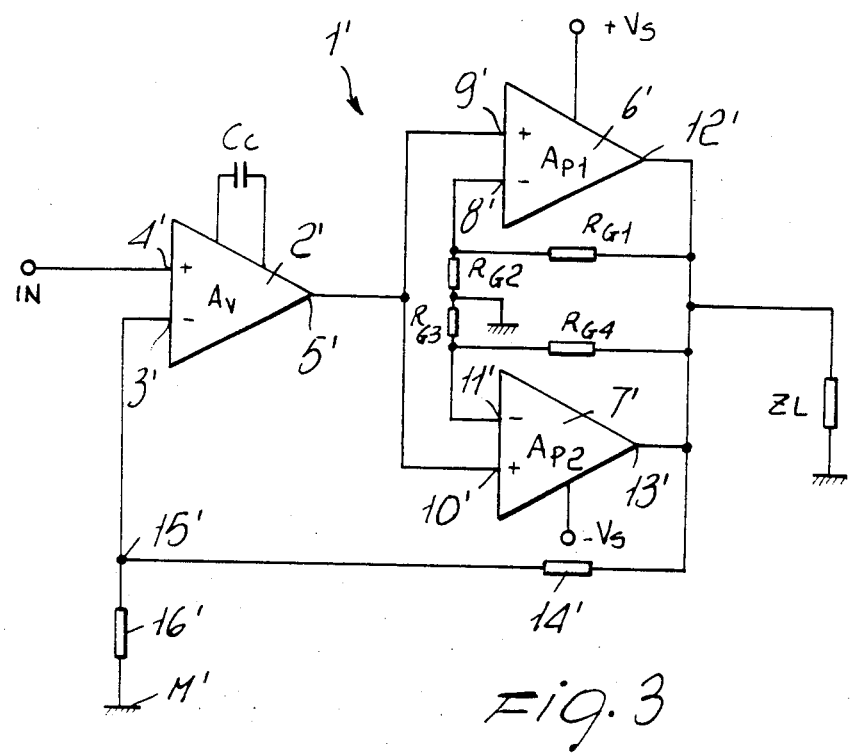
FIG. 3 is a specific circuit diagram of the low-frequency power amplifier according to the teachings of the present invention.

This aim is achieved with the structure illustrated in FIGS. 2 and 3.

With specific reference to FIG. 2, the integrated power amplifier, generally indicated with the reference numeral 1', comprises a voltage amplifier 2' having an inverting input 3', a non-inverting input 4' and an output 5', which output is connected, to drive them, to a first power amplifier means 6' and to a second power amplifier means 7', the power amplifier means 6' having a respective second or inverting input 8' and a respective first or non-inverting input 9', and the power amplifier means 7' having a respective first or non-inverting input 10' and a respective second or inverting input 11'. The respective outputs 12' and 13' of the power amplifier means 6' and 7' are connected in common and, via a first feedback block $\beta_C$, to the inverting input 3' of the voltage amplifier 2'. A compensating capacitor $C_c$ is inserted between preset contacts or pins of the voltage amplifier 2', a respective pin of the first power amplifier means 6' being connected to the $+V_s$ pole of the power supply and a respective contact of the second power amplifiers means 7' being connected to a first reference potential line $-V_s$ (power supply), the non-inverting input 9' of the first power amplifier means 6' being connected to the non-inverting input 10' of the second power amplifier means 7' and the output 5' of the voltage amplifier 2'.

According to the invention, the inverting input 8' of the first power amplifier means 6' is connected to the outputs 12' and 13', connected in common, of said first and second power amplifiers means, via a second feedback block $\beta_A$, and the inverting input 11' of said second power amplifier means 7' is connected to the outputs of said first and second power amplifier means via a third feedback block $\beta_B$.

Still according to the present invention, the first, the second and the third feedback blocks are selected with a nature and gain such that, in order to avoid oscillations in the power stages, at the frequency at which the phase difference of said stages exceeds 180°, the loop gain:

$$A_{p1}(f) \cdot \beta_A(f)$$

or $$A_{p2}(f) \cdot \beta_B(f)$$

takes on values below 0 dB, $A_{p1}(f)$ being the transfer function of the first power amplifier means 6', $A_{p2}(f)$ being the transfer function of the second power amplifier means, $\beta_A(f)$ being the transfer function of the feedback block of $\beta_A$ and $\beta_B(f)$ being the transfer function of the feedback block $_B$.

With reference now to FIG. 3, it illustrates a possible embodiment of the block circuit according to FIG. 2, in which, as obvious to those skilled in the art, generic feedback blocks $\beta_A$, $\beta_B$, $\beta_C$ have been substituted for specific feedback blocks composed of resistive elements.

In particular, the integrated power amplifier 1' of FIG. 3, showing a typical embodiment of an audio amplifier, comprises a voltage amplifier 2', having an inverting input 3', a non-inverting input 4' and an output 5', which output is connected, to drive them, to a first power amplifier means 6', and to a second power amplifier means 7', each having a respective inverting input 8', 11' and a respective non-inverting input 9', 10' and a respective output 12' and 13', the outputs 12' and 13' of the power amplifier means 6' and 7' being connected in common and, via a first resistor 14', to the inverting input 3' of said voltage amplifier 2', the point 15' connecting said first resistor 14' to the inverting input 3' of the voltage amplifier 2' being connected to ground M' via a second resistor 16', a compensating capacitor $C_c'$ being inserted between preset pins of the voltage amplifier 2', a respective pin (not specifically numbered) of the first power amplifier means 6' being connected to a second reference potential line $+V_s$ and a respective pin (not specifically numbered) of the second power amplifier means 7' being connected to the first reference potential line $-V_s$, the non-inverting input 9' of the first power amplifier means 6' being connected to the non-inverting input 10' of the second power amplifier means 7' and to the output 5' of the voltage amplifier 2'.

According to the invention, the inverting input 8' of the first power amplifier means 6' is connected to the inverting input 11' of the second power amplifiers means 7' via a third resistor $R_{G2}$ and a fourth resistor $R_{G3}$ interconnected to each other, the interconnection point of said resistors being connected to ground.

The other respective end of the third resistor $R_{G2}$ is connected, via a fifth resistor $R_{G1}$, to the output 12' of the first power amplifier means 6', and the other respective end of the fourth resistor $R_{G3}$ is connected, via a sixth resistor $R_{G4}$, to the output 13' of the second power amplifier means 7'.

As can be seen, the stabilizing R-C network is missing also in the power amplifier means according to the invention of FIG. 3.

In particular, the same stabilizing task is carried out by feedback resistors $R_{G1}$, $R_{G2}$, $R_{G3}$ and $R_{G4}$, of the two power amplifier means 6' and 7', having suitable values.

More specifically, these values are selected so that closed loop gain (defined as $A_p/1+A_p\cdot\beta$), with $A_p$ being the transfer function of amplifier means 6' or 7' and $\beta$ being the transfer function of the feedback resistive network including $R_{G1}$, $G_{G2}$ or $R_{G3}$, $R_{G4}$), is not unitary, but is equal to G dB, with G>0 dB.

In this manner, at the frequency at which the phase shift of the open-loop transfer or loop gain function of the two power amplifying stages including the power amplifier means 6',7' and the feedback resistors is of approximately 180°, the closed loop gain will be smaller than 0 dB.

More specifically, the gain G will have to be such as to ensure, with any type of load, and for any output voltage, the stability of the system.

In particular, the inventor has been found that for power amplifier means 6' and 7' using two transistors, a gain of 6 dB can be sufficient.

Naturally, as the number of transistors of the power amplifier stage increases, higher gains may be necessary.

From the above it is clear that the invention fully achieves the intended aims. In particular, a structure of a low-frequency power amplifier of the integrated type with high stability has been provided, which stability is achieved without using either additional active components in said structure, or external R-C stabilization networks. This, as will be readily understood by the expert in the field, is an advantage both from the point of view of cost reduction and from the point of view of minimizing the wiring time of said power amplifier.

Though the invention has been described with specific reference to two particular embodiments thereof, it must be noted that it is susceptible to numerous modifications and variations, all of which are within the scope of the invention concept; as an example, the compensating capacitor $C_C$ may be connected, instead of to two preset pins of the voltage amplifier stage, to one of said pins and to the output of the voltage amplifier itself. The resistors $R_{G1}$ and $R_{G4}$ can have infinite value, while $R_{G2}$ and $R_{G3}$ having zero value. Moreover, the power supply can be provided asymmetrical with respect to the ground (first and second reference potentials different in absolute value), in which case additional uncoupling capacitors may be necessary. Finally, as an additional variation of the invention, in the place of the voltage amplifier it is possible to use a transconductance amplifier, the output current of which is proportional to the input voltage.

I claim:

1. A low-frequency power amplifier, in particular of the integrated type, comprising:
   an input amplifying stage having an input stage input and an input stage output, said input stage input receiving an input signal,
   a first and a second power amplifying stages, each said power amplifying stage including a power amplifier means and a feedback block, each said power amplifier means having power amplifier inputs and a power amplifier output, said power amplifier first inputs being connected together and to said input stage output, said power amplifier outputs being connected together, each said feedback block having first and second terminals, said first terminal of each feedback block being connected to a respective one of said power amplifier outputs and said second terminal of each feedback block being connected to a respective one of said power amplifier second inputs,
   with each said power amplifying means having a power amplifier transfer function, each said feedback block having a feedback transfer function and each said power amplifying stage having a loop gain, a closed loop gain and a phase shift, with said loop gain of each said power amplifying stage being defined as the product of said power amplifier transfer function and said feedback transfer function, with said closed loop gain of each said power amplifying stage being greater than 0 dB, wherein, at the frequencies at which said phase shift is greater than 180°, said loop gain is less than 0 dB.

2. A low-frequency power amplifier, in particular of the integrated type, comprising:
   a voltage amplifier having an inverting input, a non-inverting input and an output,
   a first power amplifying stage including a first power amplifying means and a first feedback block, said first power amplifying means having an inverting input, respective non-inverting input and an output, and said feedback block being connected in parallel between said inverting input and said output of said first power amplifying means,
   a second power amplifying stage including a second power amplifying means and a second feedback block, said second power amplifying means having an inverting input, a non-inverting input and an output, and said second feedback block being connected in parallel between said inverting input and said output of said second power amplifying means,
   with said non-inverting inputs of said first and second power amplifying means being connected together and to said output of said voltage amplifier and said outputs of said first and second power amplifying means being connected together,
   with each said power amplifying means having a power amplifier transfer function, each said feedback block having a feedback transfer function, and each said power amplifying stage having a loop gain, a closed loop gain and a phase shift, with said loop gain of each power amplifying stage being defined as the product of the respective power amplifier transfer function and the respective feedback transfer function, with said closed loop gain of each said power amplifying stage being greater than 0 dB, wherein, at the frequencies at which said phase shift is greater than 180°, each said loop gain is less than 0 dB.

3. A low-frequency power amplifier according to claim 2, wherein said first feedback block comprises a first resistor connected between said output and said inverting input of said first power amplifier means and a second resistor connected between said inverting input of said first power amplifier means and a reference potential line, and said second feedback block comprises a third resistor connected between said output and said inverting input of said second power amplifier means and a fourth resistor connected between said inverting input of said second power amplifier means and said reference potential line.

4. A low-frequency power amplifier according to claim 2, further comprising a third feedback block connected in parallel between said outputs of said power amplifying means and said inverting input of said voltage amplifier.

* * * * *